United States Patent
Ahlm

(12) 
(10) Patent No.: US 6,486,829 B1
(45) Date of Patent: Nov. 26, 2002

(54) INTEGRATED ELECTRONIC CIRCUIT COMPRISING AN OSCILLATOR WITH PASSIVE CIRCUIT ELEMENTS

(75) Inventor: Roger Ahlm, Motala (SE)

(73) Assignee: Bofors Defence AB, Karlskoga (SE)

( * ) Notice: Subject to any disclaimer, the term of this patent is extended or adjusted under 35 U.S.C. 154(b) by 0 days.

(21) Appl. No.: 09/548,058

(22) Filed: Apr. 12, 2000

Related U.S. Application Data

(63) Continuation of application No. PCT/SE98/01829, filed on Oct. 12, 1998.

(30) Foreign Application Priority Data

Oct. 22, 1997 (SE) ................................................ 9703843
Dec. 8, 1997 (SE) ................................................ 9704561

(51) Int. Cl.[7] .............................................. H01Q 3/22
(52) U.S. Cl. ..................................................... 342/375
(58) Field of Search ................. 342/375; 343/700 MS; 324/755, 765; 428/192, 209, 210, 432

(56) References Cited

U.S. PATENT DOCUMENTS

| | | |
|---|---|---|
| 4,757,318 A | 7/1988 | Pulsifer et al. |
| 5,013,979 A | 5/1991 | Birleson |
| 5,063,390 A | 11/1991 | Konig |
| 5,095,357 A | 3/1992 | Andoh et al. |
| 5,105,200 A | 4/1992 | Koepf |
| 5,518,674 A * | 5/1996 | Powell et al. ................ 264/104 |
| 5,561,434 A | 10/1996 | Yamazaki |
| 5,652,549 A | 7/1997 | Unterricker et al. |
| 5,834,945 A * | 11/1998 | Akram et al. ................ 324/755 |
| 5,985,414 A * | 11/1999 | Fukuda et al. .............. 428/192 |
| 6,188,232 B1 * | 2/2001 | Akram et al. ................ 324/755 |

FOREIGN PATENT DOCUMENTS

| | | |
|---|---|---|
| EP | 415 818 | 3/1991 |
| WO | 94/17558 | 8/1994 |

* cited by examiner

*Primary Examiner*—Dao Phan
(74) *Attorney, Agent, or Firm*—Altera Law Group, LLC

(57) ABSTRACT

An electronic circuit with at least one active electronic component (10) and a delay element connected to the component. The delay element comprises an electric conductor (13, 18) which is composed of a conductive material on an insulating layer (14) such that the conductor's capacitive coupling to the surrounding becomes low. The conductor (13, 18) is drawn such that its inductance is minimized. The electronic component (10) and conductor (13, 18) are integrated in an integrated circuit. The delay element can be used in an oscillator coupling or in an electronically controlled antenna. In the oscillator coupling the electronic component (10) comprises an inverter coupling (11) with an input (11) and an output (12). The conductor (13) is provided to connect input (11) with output (12), thus creating an oscillator. The electronically controlled antenna comprises a receiver (17) and a number of antenna elements (16) connected to the receiver (17). Individual antenna elements (16) are connected to the receiver (17) via automatically selectable delay elements (18) such that electric signals from different antenna elements (16) are differentially delayed dependent on the position of the antenna elements in relation to the impinging electromagnetic wave fronts.

18 Claims, 3 Drawing Sheets

INTEGRATED ELECTRONIC CIRCUIT COMPRISING AN OSCILLATOR WITH PASSIVE CIRCUIT ELEMENTS

This application is a continuation of international application serial number PCT/SE98/01829, filed Oct. 12 1998.

SCOPE OF THE INVENTION

The invention relates to an electronic circuit with at least one active. electronic component and a delay element connected to the component.

STATE OF THE TECHNOLOGY

In many different types of electronic circuits, components or configurations with a certain time constant or delay are used. In electronic circuits which are realized in integrated form there-are delay components separated from the other components. An example of such an electronic circuit is the oscillator.

A well-known way to set up an oscillator is to feed back a gate circuit with an inverter function, for example a simple inverter, via some form of time delay. The time delay can be implemented in various ways, for example by special delay circuits.

In applications where high working frequencies are used, and particularly when the requirements of a frequency-stable oscillator are high, a crystal oscillator is used instead. An exactly embodied crystal oscillates mechanically at a well-defined and stable frequency, and the mechanical oscillation is converted to an electric oscillation.

A problem with use of crystal oscillators is that they are relatively large. In connection with certain types of integrated circuits this becomes a problem in that a special circuit must be used with the oscillator or a crystal must be connected from outside the integrated circuit.

With known oscillators the delay that arises in RC networks normally is used, i.e., electrical networks with both resistance and capacitance.

Within higher frequency ranges antennas for transmission and reception of electromagnetic signals are used with a special embodiment for exploiting signals for: strong directional effects. The currently most common type of antenna in this connection is the parabolic antenna. So-called electronically controlled antennas or phase array antennas are becoming more common.

A phase array antenna incorporates a group of identical radiation elements. By controlled feeding of the elements by means of a conductor network so that they act in phase, an electromagnetic beam with good directionality can be achieved. The conductor network can also incorporate electronically controlled phase inverters and possibly amplifiers, one for each element, by means of which the direction of the beam can be varied without need of mechanically moveable components.

The electronically controlled phase inverters are complicated and expensive instruments, and for that reason this type of antenna has not enjoyed great commercial success. Another factor which limits the use of this type of antenna is the frequency dependency of the phase inverters. The foremost area of use for the phase array antenna is within the radar area.

SUMMARY OF THE INVENTION

One purpose of the invention is to produce an electronic circuit that can be embodied in a simple manner and that can be combined with other circuits in an integrated form. This purpose is achieved by inclusion in the invention of the special features cited in Claim 1.

According to one aspect of the invention an oscillator has been achieved that is realizable in all components in integrated form. According to another aspect of the invention an electronically controlled antenna has been achieved that lacks the disadvantages of the phase inverters. The purpose is achieved by the fact that electronic signals from individual antenna elements are differentially delayed dependent on the position of the antenna elements in relation to the impinging electromagnetic wave fronts. Emanating from one matrix of the antenna elements that are distributed across a surface, the signals can be selectively delayed from individual antenna elements and thus affect the direction in which the antenna will be sensitive. The delay is preferably produced in integrated circuits, which are provided in connection with the antenna elements. According to one embodiment an installation of conductors of different length is provided between the antenna elements and a receiving unit. A conductor of a certain length is switched on by a control unit dependent on the position of the antenna element in relation to an impinging wave front of an electromagnetic wave. The given position affects the detectable characteristics of the electric signals that are received. The installation of conductors and the control unit are joined with other electronic components in a cell unit.

The following description, drawings, and dependent patent claims explicate further advantages and special features of the invention.

BRIEF DESCRIPTION OF THE DRAWINGS

The invention will now be described in more detail with the aid of examples of embodiments with reference to attached drawings, on which FIG. 1 schematically shows an embodiment according to the invention of an electronic circuit in the form of an oscillator, FIG. 2 schematically shows the distributed resistance and capacitance of a conductor.

THE INVENTION

Figure 1:
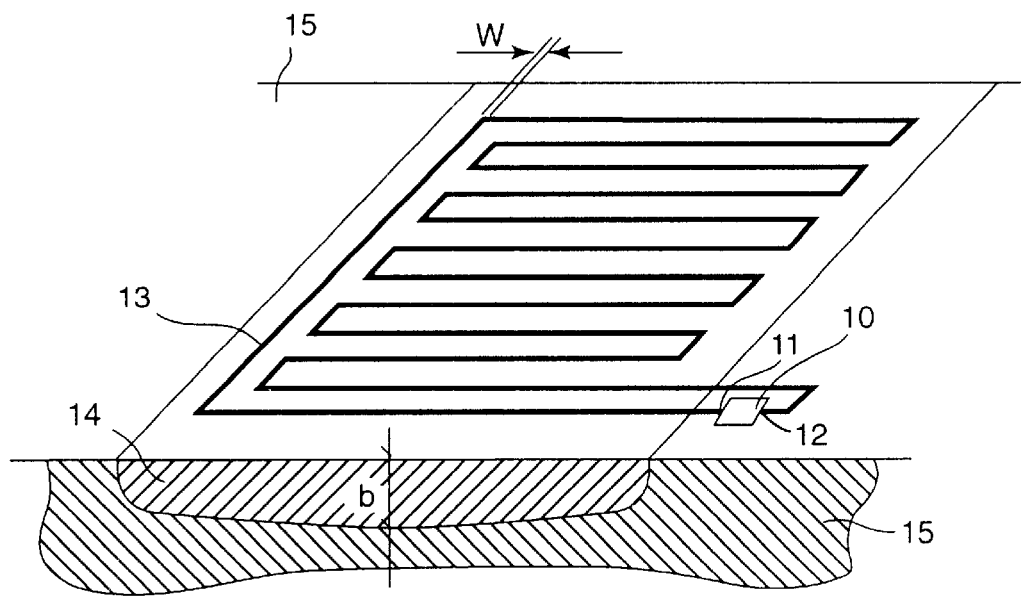

In the embodiment according to FIG. 1 an inverter coupling 10 is shown schematically, whose input 11 is connected to its output 12 via a long conductor 13. For a conductor of the length l, a time period T is given by the following formula where $v_c$ is the velocity of electromagnetic propagation in the conductor.

$$T = \frac{2l}{v_c} \qquad (1)$$

At $v_c$=200,000 km/s and a given length l of 0.5 m the frequency is 200MHz. This is under the condition that the delay in the inverter coupling itself. is on the magnitude of some picoseconds. With low propagation in the inverter coupling's delay of, for example, 10% the inaccuracy is in the same class as that of a crystal oscillator. This length required for attainment of the desired delay acts in many cases as a deterrent. The actually delay in the conductor is also dependent on the conductor's distributed resistance and the conductor's distributed capacitance.

In an ideal conductor any variations in time period and thus in frequency depend only on performance characteristics in the inverter coupling. If the delay in inverter coupling 10 is small relative to the delay in conductor 13, which primarily is dependent on the length of the conductor, the inverter coupling affects accuracy very little. The conductor is embodied as a metal conductor in an integrated process, for example a CMOS process.

Conductor 13 is embodied with width w and rests on some form of insulating layer 14. The insulating layer contains both metal oxide and field oxide and has thickness b. A semiconducting material 15, for example silicon, surrounds the portion that holds the conductor. Inverter coupling 10 and other semiconductor circuits can be embodied in semiconducting materials, whereby these are given access to the oscillator.

In one embodiment the insulating layer is constituted of silicon oxide. The insulating layer can also be embodied in glass or another ceramic material. As alterative the insulating layer can be embodied as an air layer. In such an embodiment the conductor rests on stanchion-like formations that extend from the semiconductor or base material used.

The conductor should be embodied so that it gives rise to as little inductance as possible. The conductor preferably runs in a loop with several parallel conductor sections so that the directions of the current in adjacent conductor sections are opposite to each other. It is also possible to provide two parallel loops in opposition or in double loops.

Figure 2:
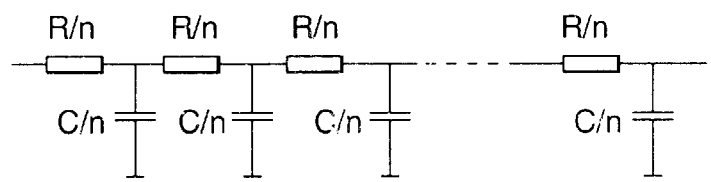

In an actual conductor time delay occurs as a result of the conductor's distributed resistance and the conductor's distributed capacitance according to the formula below. The distributed characteristics can be illustrated according to FIG. 2. The total length of the conductor is l. In FIG. 2, C is the total capacitance of the conductor, and R is the total resistance of the conductor. The resistance is generally given by the following formula:

$$R = \frac{\rho \cdot l}{A} = \frac{\rho \cdot l}{a \cdot w} = \frac{K_r \cdot l}{w} \quad (2)$$

$$K_r = \frac{\rho}{a}$$

$$C = \varepsilon \cdot \frac{A}{d} = \varepsilon \cdot \frac{w \cdot l}{b} = K_c \cdot w \cdot l \quad (3)$$

where $$K_c = \frac{\varepsilon}{b}.$$

For the formulas:
ε=the dielectricity constant for the insulated (oxide) layer,
ρ=the resistance in the conductor material,
a=the thickness of the conductor,
b=the thickness of the insulating (oxide) layer, and
w=the narrowest width of the conductor.
From the associations above the time delay is given:

$$t_{RC} = \sum_0^n \frac{R}{n} \cdot \frac{C}{n} \text{ when } n \to \infty \quad (4)$$

The time delay can be reformulated as time delay in small time segments, where the following obtains:

$$\Delta t_{RC} = \Delta R \cdot \Delta C = K_r \cdot \frac{\Delta l}{w} \cdot K_c \cdot w \cdot \Delta l = K_{rc} \cdot \Delta l^2 \quad (5)$$

The constants used previously are consolidated here in a new constant $K_{rc}$, for which the following obtains:

$$K_{rc} = \frac{\varepsilon \cdot \rho}{a \cdot b}$$

This constant is strongly dependent on temperature and voltage, for which reason it should be minimized. It should be noted that the time delay does not depend on the line width of the processor. After transition to infinitely small time segments the following formula obtains:

$$t_{RC} = \int_0^x K_{rc} l^2 \, dl = K_{rc} \frac{x^3}{3} \quad (6)$$

Figure 3:
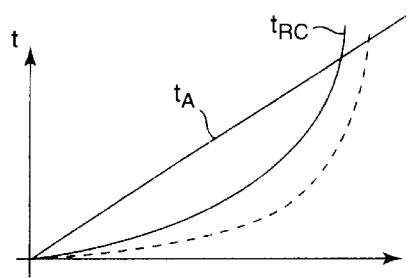
FIG. 3 is a diagram of the delay in a conductor as a function of the length of the conductor.

The diagram in FIG. 3 with the curve $t_A$ shows the delay that depends on the velocity of propagation in the conductor. The curve $t_{RC}$ shows the delay that depends on the resistance R of the conductor and capacitance C. The velocity of propagation in the conductor cannot be affected to any great degree.

As emerges from the above formulas, the effect of $t_{RC}$ is lower the thicker the insulating layer is and the thicker the conductor which is used. The dashed line in FIG. 3 shows how the curve $t_{RC}$ is affected when the insulating layer and the conductor are made thicker. By using the area in which the effect from $t_{RC}$ is low, the oscillator can have good stability and its frequency of oscillation is completely controlled essentially by the length of the conductor. Insulation layer 14 is embodied preferably with significantly greater thickness b than the occurring oxide layer. A suitable thickness exceeds 10 μm and is preferably in the range of 10–100 μm if the oscillator is to be used at frequencies around 1 GHz. The thickness w of conductor 13 is in commonly occurring processes around 1 μm, and an increase in thickness, but not width, improves the oscillator's characteristics and performance.

Inductive characteristics also need special attention as regards the length of the conductor. It is thus not suitable to embody the conductor in a spiral form or similar. The length should also be suited to the desired wavelength of the oscillator. The length of the conductor preferably amounts to a multiple of the half wavelength or, more preferably, half the wavelength.

Figure 4:
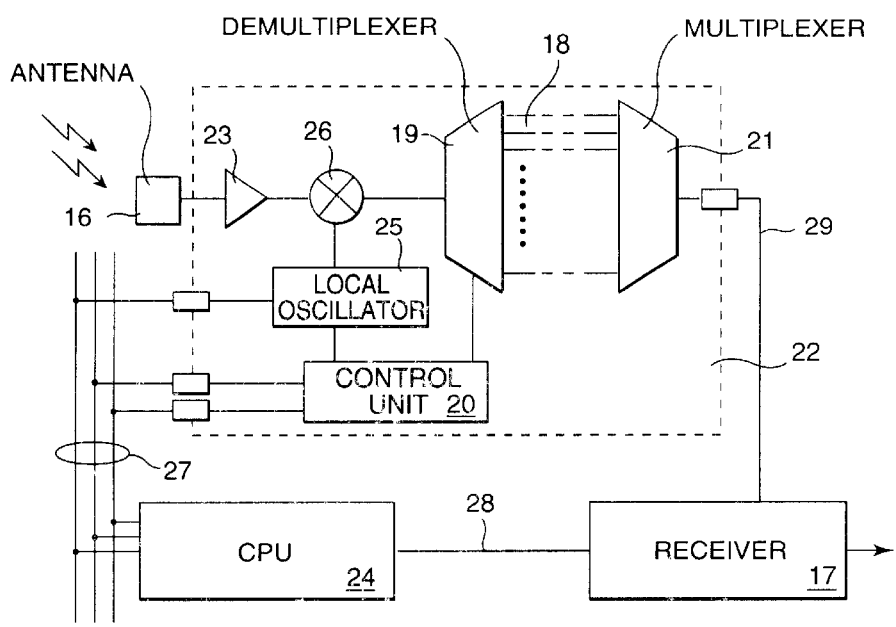
FIG. 4 is a principle block diagram that shows an alternative embodiment according to the invention of an electronic circuit in the form of a cell unit with antenna peripherals.

In the embodiment according to FIG. 4 the invention comprises antenna elements 16, which are connected to a cell unit 22. Cell unit 22, which is designated by dashed lines in FIG. 4, contains an installation of individually switchable delay elements 18, by means of which a signal received in antenna element 16 is directed on to a receiver 17 acting in common for a number of cell units 22. The received signal is amplified in an amplifier 23.

Switching of delay elements 18 is accomplished in the embodiment according to FIG. 4. by means of a demultiplexer 19 and a multiplexer 21. Delay elements 18 in the form of conductors connect demultiplexer 19 and multiplexer 21, and an individual delay element 18 is switched by means of adjustment of demultiplexer 19 and/or multiplexer 21. Adjustment is done by a control unit 20, which is connected to a central processing unit (CPU) 24 in common for several cell units 22.

In order to lessen problems with persistent capacitive and inductive coupling, among other things, whereby the incoming signal can have a frequency on the order of magnitude of 12 GHz, the incoming signal is preferably merged with a signal from a local oscillator 25 and sent to a mixer 26. From mixer 26 the signal suitably has a frequency on the order of magnitude of some GHz.

The different control units 20 and possibly also the local oscillators 25 are connected to a CPU 24, preferably by a buss connection 27. It can be suitable to include in CPU 24 means for synchronization of the different oscillators 25. Synchronization can also occur via control unit 20. According to an alternative embodiment (not shown) the oscillator is not included in the cell unit. A common oscillator is instead preferably located in the CPU. The embodiment of the oscillator used should be adjustable for different frequency bands.

All components, which are included in cell unit 22, can be embodied to be integrated in semiconducting materials. The semiconductor process used should be selected with regard to high frequency characteristics, especially as regards amplifier 23, and to characteristics that affect conductors that can be included in the delay elements. The noise ratio should be on the order of magnitude of 0.5 dBu. Very low capacity switches should be sought. The conductor is embodied as a metal conductor in an integrated process, for example a CMOS process.

Receiver 17 can be embodied in a conventional way as a satellite receiver. It can be the case that satellite receivers are provided with control instruments for motorized control of a conventional parabola antenna. Receiver 17 includes similar control instruments, and a control output 28 transfers control information to CPU 24. The control information can include instructions to sweep with the electrically controlled antenna across a certain arc in connection with finding a new transmitter. When a transmitter is found, the control information will continuously control the adjustment of the antenna so that the transmitter can be followed if the antenna is physically angled or displaced in relation to the transmitter. A signal conductor 29, preferably from each of the cell units 22, conducts a received signal from the antenna to receiver 17. The quality and certain characteristics of the signal from the antenna affect how CPU 24 will be controlled in turn in order to affect the different control units 20 in the cell units 22. The number of delay elements 18, which are required in order that the desired possibilities for fine tuning of the antenna can be achieved, vanes with the current application. For normal satellite receiver application some hundreds of delay elements 18 should be sufficient. The characteristics of amplifier 23 also affect how many delay elements 18 are required. With very good amplification characteristics and signal-noise relation in the amplifier the number of directionally adjusting delay elements 18 can be held down.

Figure 5:
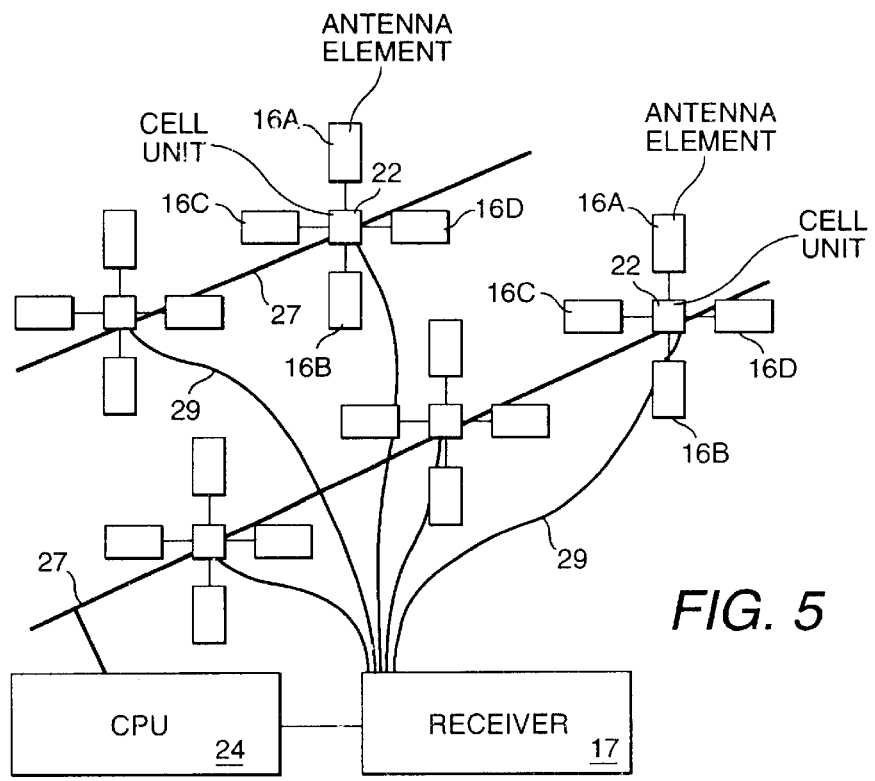
FIG. 5 shows in principle how several cell units are provided on a portion of an antenna surface, and FIG. 6 schematically shows an embodiment of a delay element in the form of a conductor, which constitutes part of the invention.

An antenna embodied with components according to the above can be embodied as indicated by FIG. 5. Provided on a surface are a number of cell units 22. Every cell unit 22 is connected to four antenna elements 16A–16D attached in pairs. Two opposing first antenna elements 16A and 16B are dedicated to reception of horizontally polarized signals, and two opposing second antenna elements 16C and 16D are dedicated to reception of vertically polarized signals. Other configurations can also be used for reception of different types of signals. Every antenna element 16A-16D can be some millimeters long and wide, and different forms can occur. Antenna elements 16A–16D are preferably embodied of metal. The outer dimensions of the antenna with a suitable number of antenna elements can be such that the surface of the antenna is on the order of magnitude of 0.1–1.0 $m^2$.

Buss connection 27 preferably runs through, or past each cell unit 22. The different antenna elements 16A–16D can be attached to amplifier 23 directly or via a multiplexer, which is suitably controlled by control unit 20.

Figure 6:
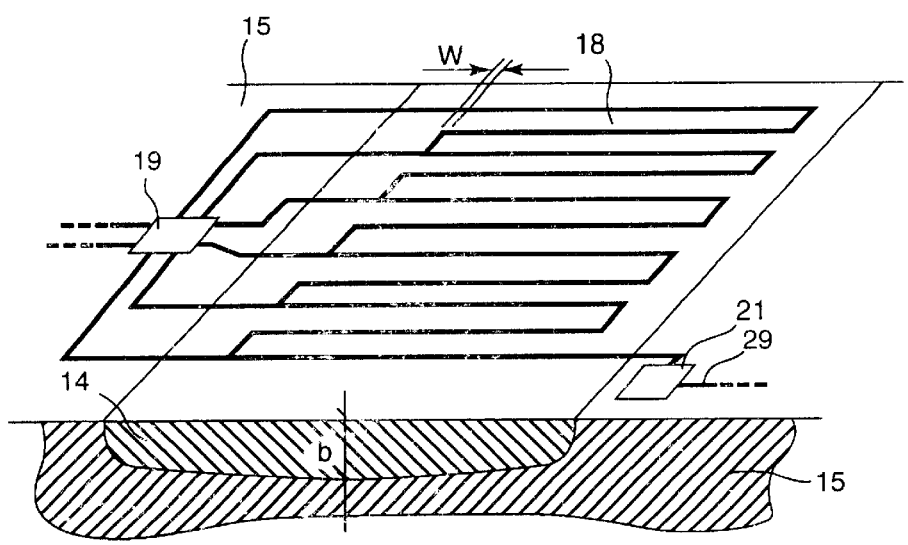

FIG. 6 shows in principle how conductors 18 can be embodied. Each conductor 18 is embodied with width w and rests on some form of insulating layer 14. The insulating layer is normally comprised of both metal oxide and field oxide and had thickness b. A semiconducting material 15, for example silicon, surrounds the section that supports the conductor. In the semiconductive material amplifier 23 and further semiconductor circuits can be embodied.

In one embodiment the insulating layer is made of silicon oxide. The insulating layer can also be embodied of glass. As an alternative the insulating layer can be embodied as a layer of air. In such an embodiment the conductor rests on stanchion-like formations which emerge from the semiconductive or base material used.

A suitable thickness exceeds 10 $\mu$m and preferably lies in the range of 10–100 $\mu$m, if the apparatus is to be used at frequencies around some GHz. The thickness of the conductor is in normally occurring processes around 1 $\mu$m, and an increase of thickness, but not of width, improves the characteristics and performance of the delay elements.

What is claimed is:

1. An integrated electronic circuit, comprising:
    a delay element formed by an electric conductor; and
    at least one electronic component connected to said electric conductor, wherein said conductor is formed such that its inductance is minimized, said conductor is formed by a conductive material on an insulating layer such that the conductor's capacitive coupling to the surrounding becomes low, and the thickness of the insulating layer exceeds 10 $\mu$m, so as to provide a low capacitive coupling between the conductor and the surrounding.

2. The electronic circuit according to claim 1, wherein said conductor is drawn in the form of conductor sections that run parallel, the directions of current being reverse in adjacent conductor sections.

3. The electronic circuit according to claim 1, wherein said electronic component comprises an inverter coupling with an input and an output, and that at least one conductor is provided to connect input with output, thus creating an oscillator.

4. An electronic circuit according to claim 1, wherein said insulating layer is composed of oxide material.

5. An electronic circuit according to claim 3, wherein the inverter coupling and conductor are made in a semiconductor process with semiconductors/metal on glass/ceramics.

6. An electronic circuit according to claim 1, wherein said insulating layer is composed of air.

7. An electronic circuit according to claim 1, wherein the thickness of the insulating layer exceeds 20 $\mu$m.

8. An electronic circuit according to claim 1, wherein the thickness of the conductor exceeds 1 μm.

9. An electronic circuit according to claim 3, wherein said inverter coupling is made of semiconductor material.

10. An electronic circuit according to claim 3, wherein said inverter coupling is made in a process which includes silicium on the insulator.

11. An electronic circuit according to claim 1, wherein the length of said conductor exceeds 0.2 m.

12. An electronic circuit according to claim 1, further comprising an electronically controlled antenna, a receiver, and a number of antenna elements connected to said receiver, wherein individual antenna elements are connected to the receiver via automatically selectable delay elements such that electric signals from different antenna elements are differentially delayed dependent on the position of the antenna elements in relation to the impinging electromagnetic wave fronts.

13. An electronic circuit according to claim 12, wherein said delay elements comprise electrical conductors of different lengths.

14. An electronic circuit according to claim 12, wherein individual antenna elements are connected to said delay elements via a demultiplexer, individual antenna elements are connected to said receiver via a multiplexer, and said demultiplexer is operatively connected to a control unit such that an individual delay element is switched dependent on the characteristics of the received electric signals.

15. An electronic circuit according to claim 14, wherein said demultiplexer, multiplexer and control unit are provided together with said delay elements in a cell unit made as an integrated circuit, and that an antenna element is associated with a cell unit.

16. An electronic circuit according to claim 14, wherein said receiver is connected to a Central Processing Unit for transfer of control information for controlling the antenna, and that said CPU is connected to the control units associated with said antenna elements.

17. An electronic circuit according to claim 14, wherein individual antenna elements are connected to said demultiplexer via an amplifier.

18. An electronic circuit according to claim 14, wherein individual antenna elements are connected to said demultiplexer via a mixer, and that said mixer is also connected to an oscillator.

* * * * *